(12) United States Patent
Ono et al.

(10) Patent No.: US 7,611,993 B2
(45) Date of Patent: Nov. 3, 2009

(54) PLASMA PROCESSING METHOD AND PLASMA PROCESSING APPARATUS

(75) Inventors: Tetsuo Ono, Iruma (JP); Katsumi Setoguchi, Ome (JP); Hideyuki Yamamoto, Kudamatsu (JP)

(73) Assignee: Hitachi High-Technologies Corporation, Tokyo (JP)

( * ) Notice: Subject to any disclaimer, the term of this patent is extended or adjusted under 35 U.S.C. 154(b) by 266 days.

(21) Appl. No.: 11/696,827

(22) Filed: Apr. 5, 2007

(65) Prior Publication Data

US 2007/0184562 A1    Aug. 9, 2007

Related U.S. Application Data

(60) Division of application No. 11/111,873, filed on Apr. 22, 2005, now abandoned, which is a continuation of application No. 10/781,717, filed on Feb. 20, 2004, now Pat. No. 6,888,094, which is a continuation of application No. 10/229,034, filed on Aug. 28, 2002, now Pat. No. 6,700,090.

(30) Foreign Application Priority Data

Apr. 26, 2002    (JP) .............................. 2002-125187

(51) Int. Cl.
   *H01L 21/302*    (2006.01)
(52) U.S. Cl. ........................ 438/714; 438/706; 438/710; 156/345.44
(58) Field of Classification Search ................. 438/706, 438/710, 712, 714, 720, 729; 156/345.44, 156/345.28, 44
See application file for complete search history.

(56) References Cited

U.S. PATENT DOCUMENTS 4,585,516 A    4/1986   Corn et al.

(Continued)

FOREIGN PATENT DOCUMENTS

JP    61-13625    1/1986

(Continued)

*Primary Examiner*—Lan Vinh
(74) *Attorney, Agent, or Firm*—Antonelli, Terry, Stout & Kraus, LLP.

(57) ABSTRACT

A plasma processing method for processing a sample by applying a high-frequency bias power periodically for each one period (T) which is divided along a time axis into a first sub-period (T1) for which feedback control of a CD gain is executed, a second sub-period (T2) for which feedback control of a select ratio is executed, and a third sub-period (T3) for which feedback control of both the CD gain and the select ratio are executed. The applied power is set at a large value in the first sub-period, and a duty ratio T1/T is controlled in accordance with the CD gain. A plurality of samples are processed with preset process conditions, and feedback control for each processing unit of the samples is executed in accordance with a processing state of each of the samples so that an average applied power over the one period (T) is constant.

2 Claims, 13 Drawing Sheets

U.S. PATENT DOCUMENTS

| | | |
|---|---|---|
| 5,350,454 A | 9/1994 | Ohkawa |
| 6,214,162 B1 | 4/2001 | Koshimizu |
| 6,562,190 B1 | 5/2003 | Kuthi et al. |
| 6,586,887 B1 | 7/2003 | Oogoshi |
| 6,700,090 B2 | 3/2004 | Ono |
| 6,828,249 B2 | 12/2004 | Odor et al. |
| 2002/0066537 A1* | 6/2002 | Ogino et al. ........... 156/345.44 |
| 2003/0000644 A1* | 1/2003 | Subramanian et al. . 156/345.24 |
| 2003/0132198 A1 | 7/2003 | Ono |
| 2004/0168766 A1 | 9/2004 | Sakai et al. |
| 2004/0178180 A1 | 9/2004 | Kaji |

FOREIGN PATENT DOCUMENTS

| | | |
|---|---|---|
| JP | 63-174320 | 7/1988 |
| JP | 6-151360 | 5/1994 |
| JP | 8-330278 | 12/1996 |
| JP | 8-339989 | 12/1996 |
| JP | 9-129594 | 5/1997 |
| JP | 10-64886 | 3/1998 |
| JP | 10-335308 | 12/1998 |
| JP | 11-297679 | 10/1999 |
| JP | 11-340213 | 12/1999 |
| JP | 2000-91325 | 3/2000 |
| JP | 2001-53069 | 2/2001 |
| JP | 2001-32617 | 11/2001 |
| JP | 2001-332534 | 11/2001 |
| WO | WO 00/52732 | 9/2000 |

* cited by examiner

L1 : CD TARGET VALUE

L2 : CD MONITORED VALUE
L2-L1 : VARIATION

PLASMA PROCESSING METHOD AND PLASMA PROCESSING APPARATUS

CROSS REFERENCE TO RELATED APPLICATION

This is a divisional application of U.S. application Ser. No. 11/111,873, filed Apr. 22, 2005 now abandoned, which is a continuation of U.S. application Ser. No. 10/781,717, filed Feb. 20, 2004 now U.S. Pat. No. 6,888,094, which is a continuation of U.S. application Ser. No. 10/229,034, filed Aug. 28, 2002, now U.S. Pat. No. 6,700,090, the subject matter of which is incorporated by reference herein.

BACKGROUND OF THE INVENTION

1. Field of the Invention

In general, the present invention relates to a plasma processing method and a plasma processing apparatus. More particularly, the present invention relates to a plasma processing method and a plasma processing apparatus that are suitable for a process to etch a substrate such as a semiconductor wafer by using plasma.

2. Related Background Art

A technology known as a technology for sustaining etching performance is disclosed in Japanese Patent Laid-Open No. H9-129594. As disclosed in the document, this technology provides a capability of control resulting in high etching uniformity, excellent pattern dimensions and a superior pattern cross-sectional shape by controlling a bias voltage in accordance with variations in plasma state detected by adoption of at least one of methods listed below after generating plasma in a gas including a reaction gas by application of a power to a first electrode. The methods are a plasma emission analysis, a mass analysis of a substance in the plasma, a measurement of a self-bias voltage of the plasma and a measurement of an impedance value of the plasma.

In Japanese Patent Laid-Open No. H11-297679, there is disclosed a technology known as a technology for fabricating a device with a fabricated-line dimension up to 1 micron to keep up with miniaturization of semiconductor devices. As disclosed in the document, this technology provides a method for fabricating a surface of a sample whereby the sample is placed on a sample base provided in a vacuum container, a processing gas is supplied to the inside of the container to be converted into plasma, a high-frequency bias with a frequency of at least 100 kHz is applied to the sample base independently of the generation of the plasma, the high-frequency bias is modulated by a frequency in the range 100 Hz to 10 kHz and the voltage of the high-frequency bias is subjected to on-off control of its peak-to-peak voltage Vpp. This peak-to-peak voltage Vpp is greater than the peak-to-peak voltage Vpp of a continuous high-frequency bias required to generate the same etching speed as the on-off control.

With semiconductor devices' speed enhancement in recent years, at the present time, the fabricated-line dimension of LSIs (Large Scale Integrated Circuits) has reached a level of 0.1 microns. Thus, it is necessary to provide a fabrication precision of ±0.01 microns for a device's electrodes and wires.

With an etching apparatus using plasma, on the other hand, there is raised a problem that the fabricated-line dimension slightly varies from wafer to wafer. For example, in an etching apparatus, the plasma is affected by the shape of the inner wall of a vacuum container and other causes. That is, when an Si wafer is etched, a substance obtained as a result of a reaction of Si is stuck to the inner wall and changes the state of the surface of the inner wall. In addition, the stuck substance is later released from the surface of the inner wall. These processes of sticking of such a substance to the inner wall as well as releasing the substance from the wall and other processes change the composition of the plasma. As a result, in sequential wafer processing to process a wafer after another, the fabricated-line width slightly varies from wafer to wafer even if the conditions of the wafer processing such as the gas' flow and pressure are maintained all the time. In the case of a fabricated-line dimension at the 0.1-micron level accompanying device miniaturization in recent years, these dimension variations, which do not raise a problem in the fabricated-line dimension at the 0.5-micron level, cause a problem of a difficulty to satisfy required fabrication precision.

In order to solve this problem, there is provided a method referred as in-situ cleaning. That is, in accordance with this method, a chamber is cleaned after each wafer processing. However, this method causes the throughput to decrease and cannot be said to be effective for all plasma processes. There is also provided another conceivable method whereby processing conditions are changed for each wafer or for each plurality of wafers. As such a method, there is provided a feedback control method like the one described in the Related Background Art.

In the conventional technology whereby a bias voltage is controlled in accordance with various kinds of information obtained from the plasma, etching selectivity changes due to a variation in bias voltage so that this technology is not suitable for a mask and a sample having an underlying film with a small thickness in some cases.

In addition, the conventional technology whereby the voltage of the high-frequency bias is subjected to on-off control does not consider control to turn the voltage of the high-frequency bias on and off in accordance with process variations in the course of processing. Thus, much like the one described above, when the bias voltage (that is, the on-off voltage value Vpp) is controlled in accordance with various kinds of information extracted from the plasma, the effect on the select ratio decreases in comparison with the continuous bias. For the select ratio with respect to a thin underlying film used in a device miniaturized to a level not exceeding 0.1 microns, however, the reduction of the effect on the select ratio still cannot be said to be sufficient.

SUMMARY OF THE INVENTION

It is thus an object of the present invention to provide a plasma processing method and a plasma processing apparatus that are capable of fabricating a device with a fabricated-line dimension of up to 1 micron while suppressing variations in fabricated-line dimension from wafer to wafer with a high degree of reproducibility without decreasing the throughput.

In order to achieve the above object, there is provided a method for carrying out plasma processing on a substrate by controlling the application of a bias to the substrate independently of generation of plasma, whereby the output value (the amplitude) of a high-frequency voltage applied to a sample base is subjected to periodical time modulation and a duty ratio of the periodical time modulation is changed for each processed substrate or for each plurality of processed substrates where the duty ratio is defined as a ratio of a subperiod, during which a large voltage is applied, to a period of the periodical time modulation.

In addition, in order to achieve the above object, a plasma processing apparatus for processing a substrate placed on a sample base installed in a vacuum container, in which plasma is generated and a high-frequency voltage is applied to the sample base, is provided with:

a high-frequency power supply connected to the sample base;

a modulation unit for periodically carrying out on-off modulation on the high-frequency voltage generated by the high-frequency power supply; and a control unit for changing a duty ratio of the on-off modulation for each processed substrate or each plurality of processed substrates.

Furthermore, a width of a line obtained as a result of fabrication of a wafer is measured and the duty ratio is changed in such a direction that the measured line width's shift from a prescribed value is corrected in case such a shift exists. As an alternative, the apparatus' state having a correlation with a fabricated-line dimension is monitored and the duty ratio is changed so that the monitored quantity is restored to a normal range in case the monitored quantity is shifted from a normal value. An example of the apparatus' state having a correlation with a fabricated-line dimension is a plasma emitted light.

It is to be noted that, in a method whereby a variation in apparatus state is monitored and fed back to correct etching conditions in order to stabilize a specific etching characteristic such as a fabricated-line dimension, it is necessary to prevent an etching characteristic other than the specific etching characteristic from changing because a certain condition is altered. An example of the other etching characteristic is the etching-speed wafer-surface uniformity. In accordance with the present invention, the output value (the amplitude) of a high-frequency voltage applied to a sample is subjected to time modulation and the duty ratio of the time modulation is changed to vary only the number of radiated ions and a radical sticking amount so that variations in fabricated-line dimension can be suppressed without affecting other characteristics such as the plasma composition and the plasma distribution.

DETAILED DESCRIPTION OF PREFERRED EMBODIMENTS

Some preferred embodiments of the present invention are explained by referring to the diagrams as follows.

First Embodiment

First of all, a first embodiment of the present invention is explained by referring to FIGS. 1 to 6. In the first embodiment, a wafer fabricated-line dimension in an etching process is measured for each wafer or each plurality of wafers and an etching condition is changed in accordance with the measured value of the wafer fabricated-line dimension. In this case, an etching condition is changed by varying a duty ratio of on-off modulation carried out on a high-frequency voltage applied to a wafer, which is used as a substrate, where the duty ratio is defined as a ratio of an ON time to a period of the on-off modulation. As a result, variations in fabricated-line dimension can be suppressed.

Figure 1:
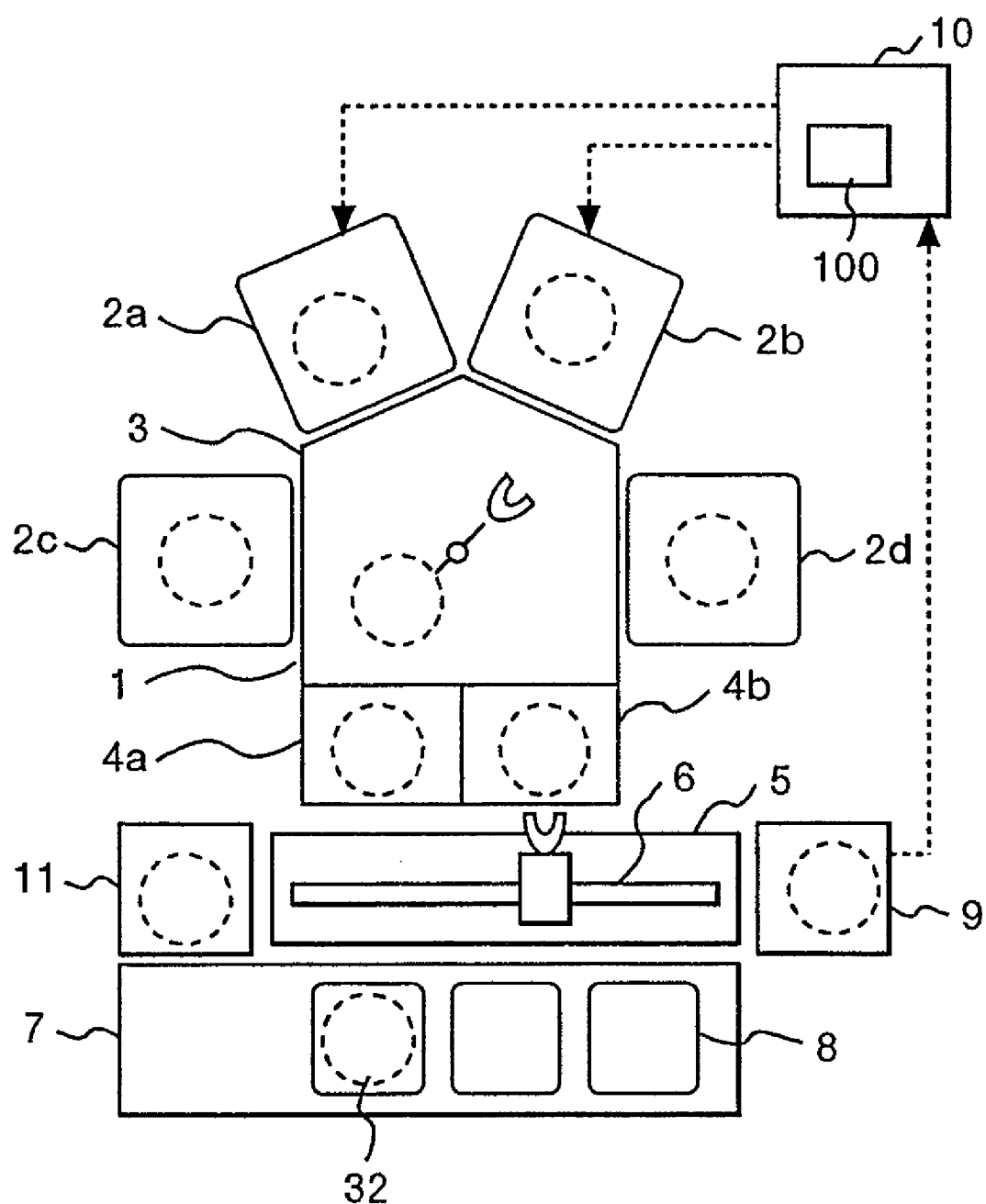
FIG. 1 is a diagram showing the whole configuration of a typical plasma processing apparatus provided by the present invention.

FIG. 1 is a diagram showing the whole configuration of a plasma processing apparatus for implementing a plasma processing method provided by the first embodiment of the present invention. In the first embodiment, a vacuum processing apparatus 1 comprises 4 plasma processing chambers 2a to 2d, a vacuum carrier chamber 3 and lock chambers 4a and 4b. The plasma processing chambers 2a to 2b as well as the lock chambers 4a and 4b are provided at locations surrounding the vacuum carrier chamber 3. Typically, the plasma processing chambers 2a and 2b are each an etching chamber while the plasma processing chambers 2c and 2d are each an ashing chamber. On the side of the lock chambers 4a and 4b of the vacuum processing apparatus 1, there is provided a carrier apparatus 5 having a carrier robot 6. The carrier apparatus 5 is sandwiched between the lock chambers 4a and 4b and a cassette base 7 on which a plurality of cassettes 8 can be placed. In addition to the vacuum processing apparatus 1, an aligner 11 and an inspection apparatus 9 are provided at locations surrounding the carrier apparatus 5. A result of a measurement carried out by the inspection apparatus 9 is supplied to a control apparatus 10 to be used in an etching-condition adjustment unit 100 employed in the control apparatus 10 as a basis for adjusting a processing condition of wafers in the plasma processing chambers 2a and 2b. It is to be noted that the control apparatus 10 is based on a computer comprising typically a CPU, a memory, a program, an external storage device and an input/output unit. The etching-condition adjustment unit 100 is implemented by elements including a program and a storage device. The program implements run-to-run control for changing quantities such as a duty ratio of a high-frequency bias for each sample or each lot unit on the basis of a measurement result supplied to the etching-condition adjustment unit 100. On the other hand, the storage device is used for storing various kinds of data required in execution of the run-to-run control.

Each cassette 8 is accommodated in a hermetically sealed container and conveyed by the carrier robot 6 employed in the carrier apparatus 5. It is desirable to keep a movement space of the carrier robot 6 in a clean gas atmosphere. It is also desirable to separate a space between the cassettes 8 and the aligner 11, a space between the aligner 11 and the lock chambers 4a and 4b or a space between the cassettes 8 and the lock chambers 4a and 4b and a space between the inspection apparatus 9 and the lock chambers 4a and 4b from the atmosphere inside the clean room. It is to be noted that, if the degree of cleanness of the atmosphere inside the clean room is high, these separations are not required.

In the plasma processing apparatus described above, a wafer completing an etching process in the vacuum processing apparatus 1 is conveyed by the carrier robot 6 from the lock chamber 4a or 4b to the inspection apparatus 9 for measuring a fabricated-line width. The inspection apparatus 9 is referred to hereafter as a length-measurement scanning electron microscope (a length-measurement SEM). The length-measurement SEM serving as the inspection apparatus 9 measures a fattening quantity relative to a design value of the fabricated line. The fattening quantity is referred to hereafter as a CD gain. A fattening quantity is measured for each wafer or each plurality of wafers as required. Data obtained as a result of the measurement is stored in a storage device employed in the control apparatus 10. The CD gain has allowable values. As an initial etching condition, that is, as an etching-process condition at the beginning of an etching process, the CD gain shall be set at a value within a range of these allowable values. If the CD gain goes beyond the range of these allowable values in continuous processing of several wafers, a data signal is supplied to the etching-condition adjustment unit 100 employed in the control apparatus 10. Receiving the signal, the etching-condition adjustment unit 100 automatically adjusts the etching condition to restore the CD gain back to the range of these allowable values. In this way, the control apparatus 10 changes and adjusts the conditions of the etching processes carried out in the plasma processing chambers 2a and 2b employed in the vacuum processing apparatus.

Figure 2A:
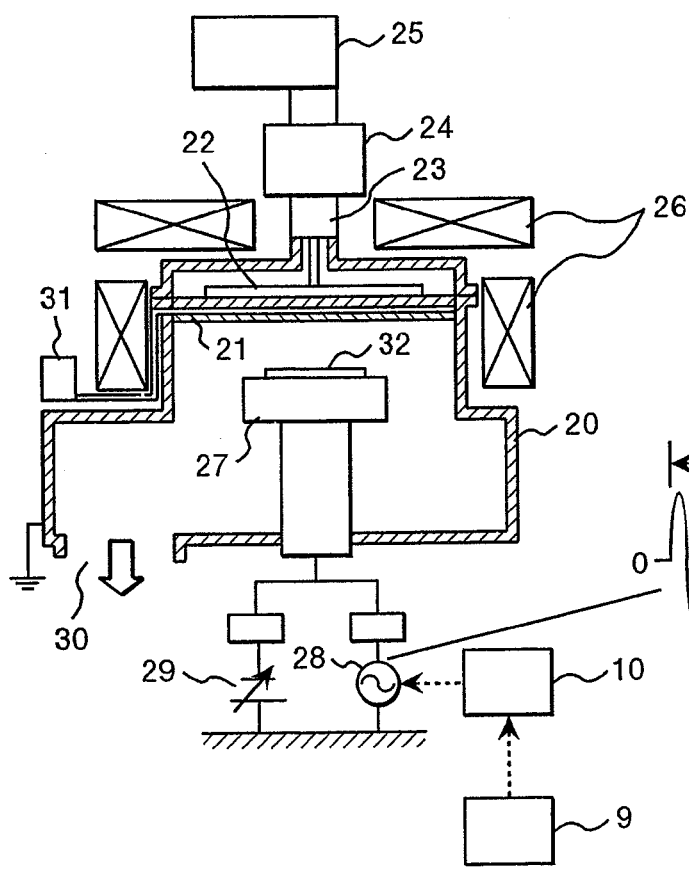
FIG. 2 is a cross-sectional diagram showing a detailed configuration of an etching unit employed in the plasma processing apparatus shown in FIG. 1.

FIG. 2A is a diagram showing a cross section of the plasma processing chamber 2a or 2b employed in the vacuum processing apparatus 1. The vacuum processing apparatus 1 implemented by this embodiment is a plasma-etching apparatus adopting an ECR technique whereby an electromagnetic wave is radiated from an antenna to generate plasma as a result of an interaction between a magnetic field and an electric field of the electromagnetic wave. An antenna 22 made of aluminum is placed on a dielectric window 21 on the top of a vacuum processing chamber 20, which serves as a plasma processing chamber. The antenna 22 is connected by a coaxial wave guide 23 and a matching unit 24 to a high-frequency power supply 25 for generating a UHF electromagnetic wave having a typical frequency of 450 MHz. The electromagnetic wave generated by the high-frequency power supply 25 is capable of passing through the dielectric window 21. Around the circumferential portion of the vacuum processing chamber 20, magnetic-field coils 26 are wound. In this embodiment, two magnetic-field coils 26 are used for generating the magnetic field cited above inside the vacuum processing chamber 20.

In the vacuum processing chamber 20, a lower electrode 27 is provided, facing the antenna 22. The lower electrode 27 serves as a sample base on which a wafer 32 serving as a sample is placed. A space exists between the dielectric window 21 and the lower electrode 27. Plasma is generated in this space. The lower electrode 27 is connected to a high-frequency bias power supply 28 for providing radiation energies to the plasma's ions hitting the wafer 32. The lower electrode 27 is also connected to an ESC power supply 29 for electrostatically attracting the wafer 32 to the lower electrode 27. Even though there is no special limitation on the frequency of the high-frequency bias power supply 28, normally, the frequency is set at a value in the range 200 kHz to 20 MHz. In this embodiment, the frequency of the high-frequency bias power supply 28 is set at 400 kHz.

Figure 2B:
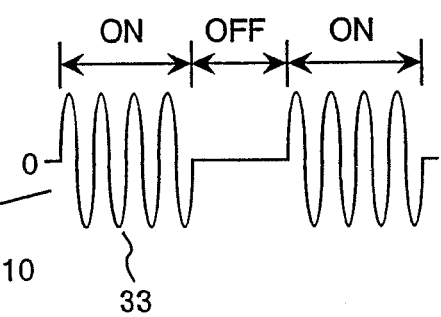

A typical waveform 33 of a high-frequency voltage applied by the high-frequency bias power supply 28 to the lower electrode 27 is shown in FIG. 2B. As shown in the figure, the high-frequency output is subjected to on-off control. A period consists of an on sub-period and an off sub-period. Control is executed to repeat such a period at a typical frequency of 1 kHz. The on-off control needs to be executed for each sample, each lot unit or each other proper unit as run-to-run control.

It is to be noted that, instead of executing the on-off control as the run-to-run control, other control can be executed to switch the high-frequency voltage from a large amplitude in a range for carrying forward the etching process to a small amplitude in a range for not carrying forward the etching process and vice versa. In accordance with a method adopted for this case to apply the high-frequency bias, 1 period is split into sub-periods t1 and t2 during which different high-frequency bias voltages are periodically applied.

An exhaust opening 30 is provided on the lower portion of the vacuum processing chamber 20. The exhaust opening 30 is connected to an exhaust apparatus not shown in the figure. Reference numeral 31 denotes a gas supply apparatus for supplying processing gas to the inside of the vacuum processing chamber 20. The gas supply apparatus 31 is connected to gas supply holes provided on the dielectric window 21. It is to be noted that the gas supply holes themselves are not shown in the figure.

In the plasma processing apparatus with the configuration described above, a UHF electromagnetic wave generated by the high-frequency power supply 25 penetrates the dielectric window 21 from the antenna 22 by way of the matching unit 24 and the coaxial wave guide 23, being supplied to the inside of the vacuum processing chamber 20. On the other hand, a magnetic field is generated by the electromagnetic coils 26 in the vacuum processing chamber 20. An interaction between the magnetic field generated by the electromagnetic coils 26 and an electric field generated by the electromagnetic wave converts the etching gas introduced in the inside of the vacuum processing chamber 20 into plasma with a high degree of efficiency. The plasma is used for carrying out a predetermined etching process on the wafer 32 placed on the lower electrode 27. In the etching process, the high-frequency bias power supply 28 controls radiation energies provided to the plasma' ions radiated to the wafer 32. As a result, a desired etching process is obtained.

Figure 3:
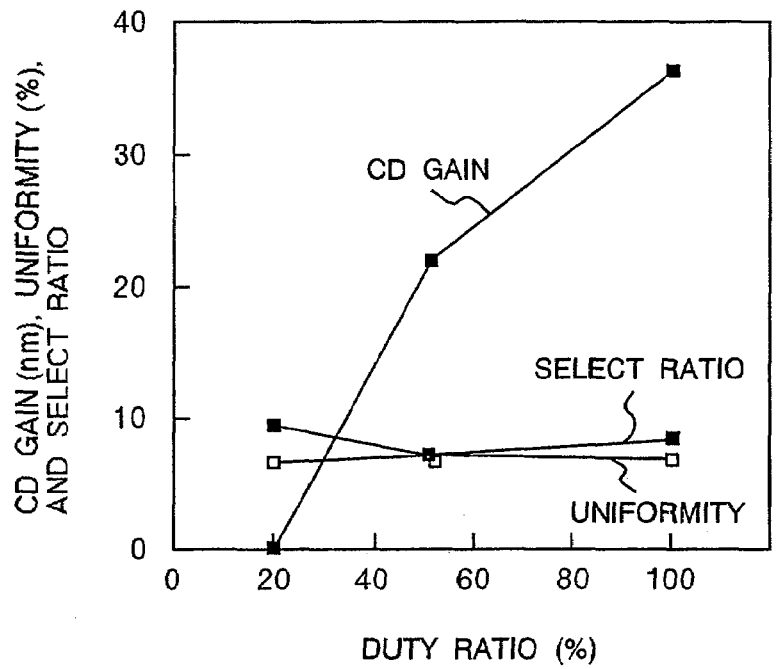
FIG. 3 is a diagram showing relations between etching characteristics (consisting of a CD gain, a select ratio and a uniformity) and the on-off duty ratio of a high-frequency voltage applied to a sample in an etching process carried out by the etching unit shown in FIG. 2.

FIG. 3 is a diagram showing experimental data representing relations of a CD gain of a poly-crystal silicon wire, a select ratio and a uniformity versus the duty ratio of a high-frequency bias. The poly-crystal silicon wire is obtained as a result of an etching process using this plasma processing apparatus. The uniformity is the base-film etching-speed wafer-surface uniformity. It is to be noted that the CD gain means a CD fattening quantity. The select ratio is a ratio of the etching speed of the poly-crystal silicon to the etching speed of an underlying film.

Normally, in fabrication of a transistor gate, it is necessary to selectively etch poly-crystal silicon with respect to a thin oxide film, which has a thickness of several nm and serves as an underlying film. For this reason, in addition to the CD gain, the select ratio with respect to the underlying oxide film and the underlying oxide film etching-speed uniformity each become an important factor. It is to be noted that etching conditions for obtaining the data shown in FIG. 3 include the use of a mixture of Cl2 with a flow rate of 18 cc/min, HBr with a flow rate of 82 cc/min and $O_2$ with a flow rate of 3 cc/min as a processing gas and the application of a processing pressure of 0.4 Pa. In addition, the output of the high-frequency bias power supply 28 is set at 35 W to execute control at a constant power. In the control to turn on and off the high-frequency output, the peak value of the power is changed so that the average consumed power over a period is 35 W. In the case of a duty ratio of 50%, for example, the peak value of the power is controlled so that the peak value is equal to the peak value of a continuous output of 70 W or so that the average is 35 W.

As is obvious from FIG. 3, when the duty ratio is controlled so that the output value of the high-frequency bias or the average power of the on-off high-frequency output is fixed, the CD gain varies in dependence on the duty ratio. That is, it is clear that in the case of a duty ratio of 100% or a continuous bias, the CD gain is large but, as the value of the duty ratio is reduced, the CD gain also decreases. This is because, as the value of the duty ratio is reduced, the amplitude of the high-frequency voltage increases in comparison with that for a duty ratio of 100% so that the radiation energies given to the plasma's ions radiated to the wafer increase. In addition, it is also obvious that the select ratio is all but independent of the duty ratio. That is, by varying the duty ratio of on-off modulation carried out on the high-frequency bias applied to the sample with the output value (the power) of the high-frequency bias kept at a constant value, only the CD gain can be changed without altering the underlying oxide film etching-speed wafer-surface uniformity and the select ratio having a big effect on fabrication of a wire or, in other words, without deteriorating the uniformity and the select ratio.

In accordance with the present invention, by execution of run-to-run control of an etching process on the basis of characteristics of the duty ratio like ones shown in FIG. 3, variations in sample fabricated-line dimension can be suppressed.

Figure 4A:
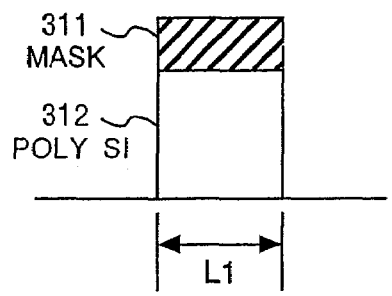
FIG. 4 is diagrams each showing typical measured (monitored) data representing the shape of a cross section of a sample being etched.
Figure 4B:
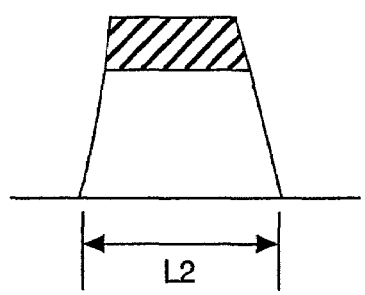

This point is explained concretely as follows. FIG. 4 is diagrams each showing the shape of a cross section obtained as a result of carrying out an etching process on a sample having a mask 311 on a poly-Si(Silicon) film 312, which serves as a material for creating a gate. To be more specific, FIG. 4A shows a target shape with a CD value L1 while FIG. 4B shows a typical processing shape fattening due to, among others, a change in etching characteristic to result in a CD value L2. The variation (L2-L1) in sample fabricated-line dimension is sustained by execution of duty-ratio feedback control at a value not exceeding a predetermined value.

Figure 5:
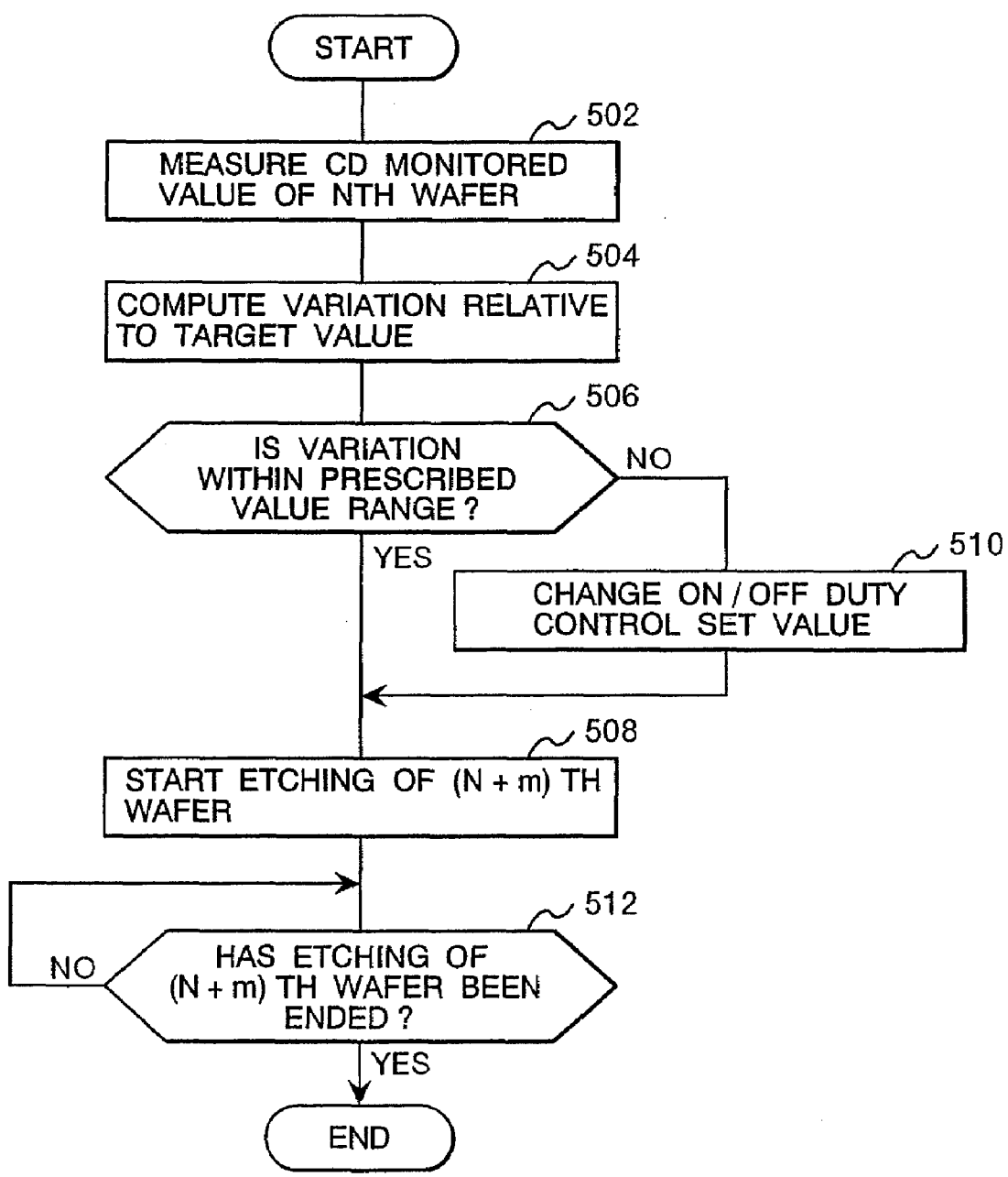
FIG. 5 shows a flowchart representing a control method of processing carried out by using the etching unit shown in FIG. 2.

FIG. 5 shows a flowchart representing duty-ratio feedback control. To be more specific, the duty-ratio feedback control is run-to-run control whereby an Nth wafer of processed wafers is measured by the inspection apparatus 9 and duty ratios of the (N+m)th wafers following the Nth wafer are controlled by the etching-condition adjustment unit 100 employed in the control apparatus 10 on the basis of the CD gain of a measured fabricated-line width where m=1, 2 and so on. At a step 502 of the flowchart, the length-measurement SEM serving as the inspection apparatus 9 carries out a CD measurement on the Nth wafer subjected to an etching process carried out by the etching-process apparatus. Then, at the next step 504, a deviation of a CD value from a target value, that is, the variation (L2-L1) shown in FIG. 4, is found. The flow of the control then goes on to a step 506 to determine whether the variation is within a specification-value range. If the variation is within the specification-value range, the flow of the control goes on to a step 508 at which the next new (N+m)th wafer is processed by using set values of the duty-ratio control as they are. If the variation is beyond the specification-value range, on the other hand, the flow of the control goes on to a step 510 at which the duty ratio is modified. Then, at the following step 508, the next new (N+m)th wafer is processed. Subsequently, the flow of the control goes on to a step 512 to determine whether the etching process of the (N+m)th wafer has been completed. An etching-end-point determination apparatus is used for determining completion of an etching process.

Figure 6:
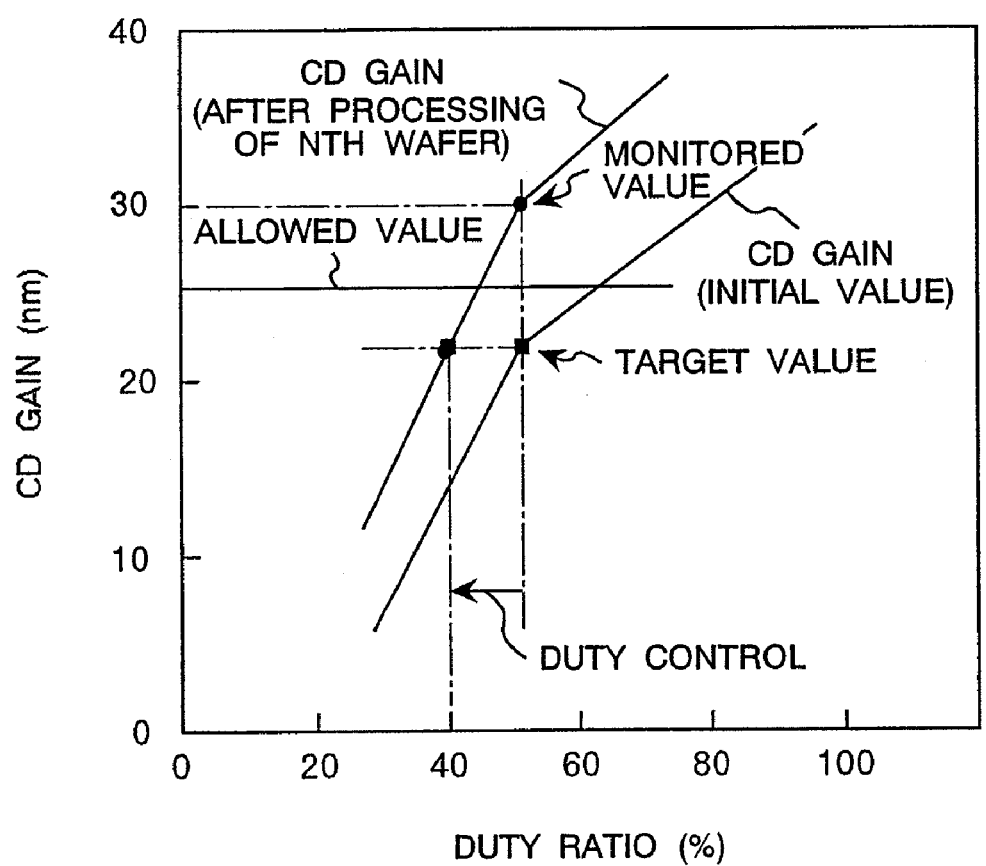
FIG. 6 is a diagram showing initial values of the CD gain in plasma processing and a typical CD-gain characteristic obtained as a result of monitoring after the processing for the Nth wafer.

FIG. 6 is a diagram showing initial values of the CD gain in plasma processing and a typical CD-gain characteristic obtained as a result of monitoring after the processing of the Nth wafer. As shown in FIG. 6, the CD gain has a predetermined allowable value (specification value). As an initial condition, the CD gain shall be set at a value smaller than this predetermined allowable value. The initial condition is an etching-process condition at the beginning of lot processing. After continuous processing is carried out on several wafers such as Si wafers, on the other hand, a reaction-generated substance of the silicon is stuck gradually to the inner wall of the plasma processing chamber, changing the surface condition of the inner wall. As a result, the plasma is affected, changing the CD gain even if the etching condition is unchanged. Then, as the CD gain exceeds the allowable value, a data signal is supplied to the etching-condition adjustment unit 100 employed in the control apparatus 10. Receiving the signal, the etching-condition adjustment unit 100 automatically adjusts the etching condition to restore the CD gain back to a value smaller than this allowable value. In this way, the control apparatus 10 changes and adjusts the conditions of the etching processes carried out in the plasma processing chambers 2a and 2b employed in the vacuum processing apparatus.

A change/adjustment amount is found as shown in FIG. 6. Assume for example that, at an initial value, the CD target value is set at 0.23 microns and the duty ratio for the CD target value is set at 50%. Let the specifications prescribe a CD variation of ±5 nm and the CD variation increase by 7 nm. In this case, as is obvious from the characteristic expressed in terms of concrete data in advance as shown in FIG. 6, reduction of the duty ratio by about 10% results in a CD-gain decrease of 7 nm. Thus, the duty-ratio feedback control is executed to set the duty ratio at 40% for the process of the next wafer. By execution of the duty-ratio feedback control, the CD value of the next wafer can be restored to the target value of 0.23 microns.

Relations between the CD gain and the duty ratio like ones shown in FIG. 6 vary if the structure of the processed wafer and/or the etching condition change. It is thus necessary to create a database for storing data obtained for each actual process in advance or to build a database from data accumulated for each wafer process and make the database usable in the control apparatus 10.

It is to be noted that, even by adoption of a method for increasing the power of a continuously applied high-frequency bias, since the ion energy increases, the degree of fattening of the shape or the CD gain can also be reduced. In this case, however, with the ion energy merely increasing, there is no off-bias sub-period not accelerating ions. Thus, the etching speed of the oxide film also increases at the same time. As a result, there is raised a problem that the select ratio decreases and the underlying oxide film breaks.

In accordance with the embodiment described above, for small shifts in fabricated-lime width from wafer to wafer, which are caused by changes or variations in composition of plasma generated in a vacuum processing chamber in repeated wafer processes, the duty ratio of a high-frequency bias power supply is subjected to feedback control in accordance with a value of the CD gain so that the fabricated-line width of a wafer can be set at an optimum value and required fabrication precision can be realized. Thus, variations in fabricated-line dimension from wafer to wafer can be suppressed to provide an effect that fabrication can be carried out with a high degree of reproducibility.

In addition, the duty ratio can be changed by adjusting the CD gain of the order of nm units with ease. Thus, the method implemented by this embodiment is suitable for fabrication of infinitesimal semiconductor devices of a dimension level in the range 0.1 microns 0.05 microns having a problem that the fabricated-line dimension varies from wafer to wafer.

Furthermore, in order to sustain the duty ratio of the high-frequency bias all the time, it is possible to execute feed-forward control as the run-to-run control as soon as a change in CD-gain value starts appearing before the CD gain obtained after fabrication of a wafer goes beyond the allowable range on the basis of data stored in the etching-condition adjustment unit 100 described earlier.

Moreover, even though a length-measurement SEM is generally used as the apparatus for measuring a fabricated-line dimension, the length-measurement SEM has a problem of an incapability of measuring a width of poly-crystal silicon in case the shape becomes thin due to observation from a position above the object of observation, that is, in case the width of the poly-crystal silicon is smaller than the dimension of a resist. In place of the length-measurement SEM, as a technique for finding a shift or a change in fabricated-line width, it is possible to adopt a method for finding a shift from a design value of the fabricated-line dimension by measuring an electrical-resistance value of a wire or a method for estimating a shape of a wire from reflection or diffraction of a light. If the inspection apparatus 9 adopts these methods to adjust the duty ratio by execution of feedback control or feed-forward control for an etching condition, correction is possible even if the fabricated shape becomes thin.

In addition, in the case of the run-to-run control or a process to adjust an etching condition by measuring a fabricated-line dimension, the process can be set for each wafer or each plurality of wafers or set in accordance with a processing condition of a wafer.

Furthermore, etching conditions adjusted by the etching-condition adjustment unit 100 in accordance with a variation in CD gain include at least a duty ratio. In addition to the duty ratio, it is also possible to finely adjust other conditions such as a gas pressure and a gas composition.

Second Embodiment

Figure 7:
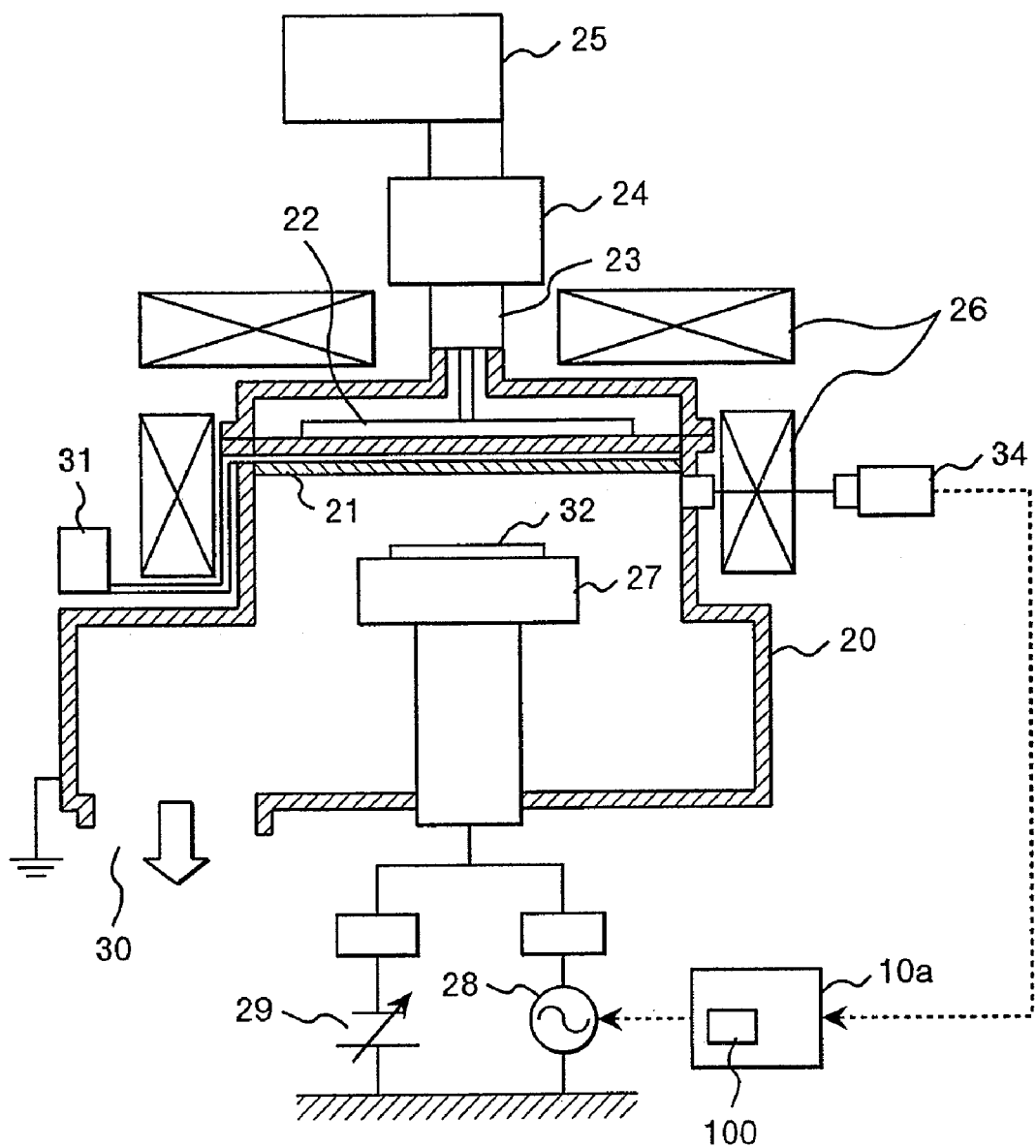
FIG. 7 is a cross-sectional diagram showing an etching unit implemented by a second embodiment of the present invention.
Figure 8:
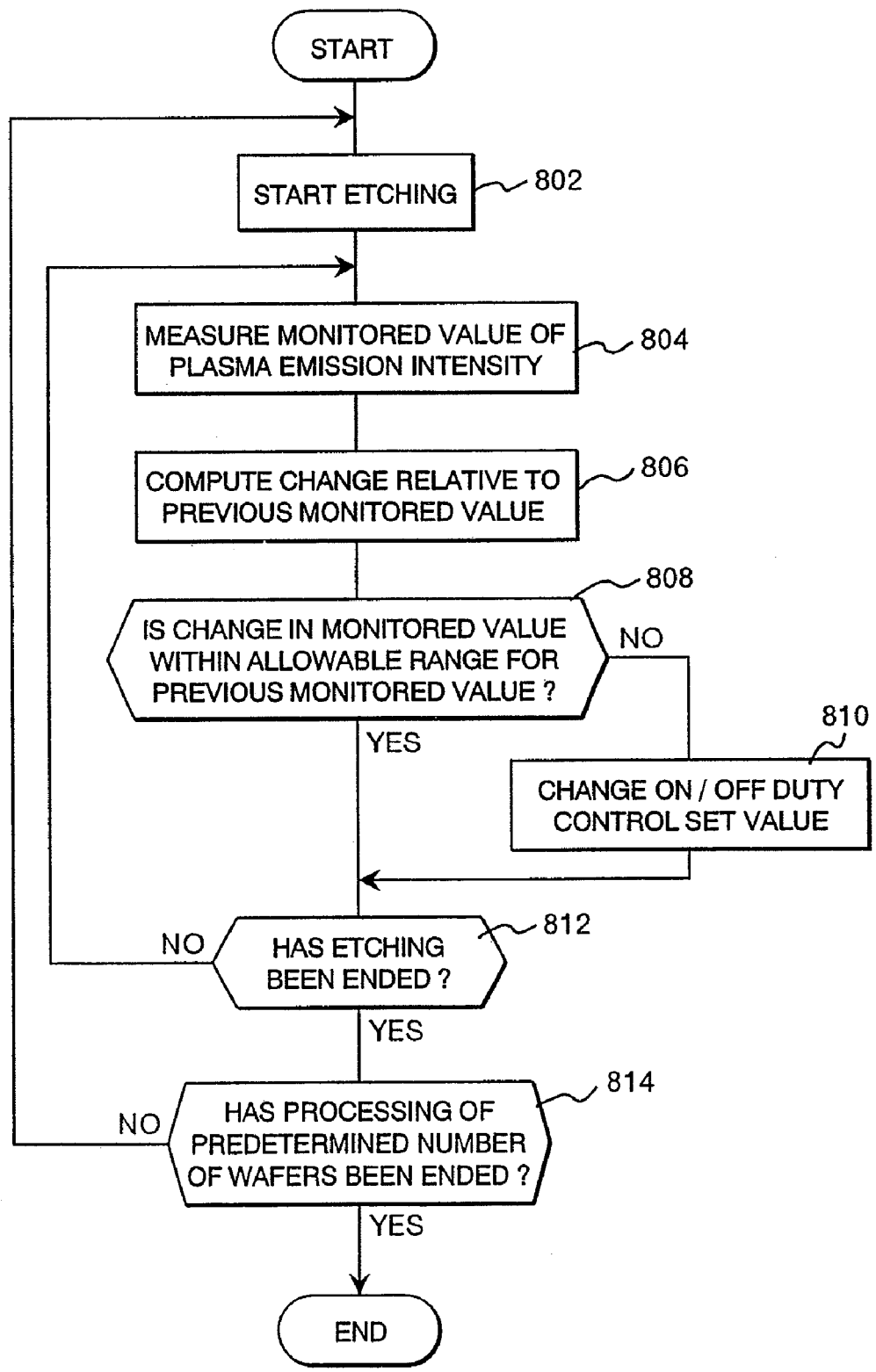
FIG. 8 shows a flowchart representing processing carried out by using the etching unit shown in FIG. 7.

Next, a second embodiment of the present invention is explained by referring to FIGS. 7 and 8. In FIG. 7, components identical with their respective counterparts shown in FIG. 2 are denoted by the same reference numerals as the respective counterparts and the explanation of the identical components is not repeated. The second embodiment is different from the first embodiment shown in FIG. 2 in that, in the case of the second embodiment, a device for monitoring a plasma light is employed in place of the inspection apparatus 9 so that control variables such as the duty ratio can be adjusted in accordance with a change in plasma-generation state. That is, a light-taking window for optically taking a plasma light is provided for a plasma generation unit serving as a processing space of the vacuum processing chamber 20. An emitted-light monitor 34 is connected to the light-taking window by an optical fiber. The emitted-light monitor 34 is used for measuring an emitted-light spectrum of a plasma light taken by the light-taking window. The emitted-light monitor 34 converts the emitted-light spectrum into an electrical signal, and supplies the electrical signal to a control apparatus 10a.

The etching shape varies from wafer to wafer because a reaction-generated substance such as silicon chloride is stuck on the inner wall of the vacuum processing chamber 20, changing the state of the plasma in some cases. If the reaction-generated substance stuck on the inner wall is released and stuck on the wafer 32, for example, the CD gain increases. At the same time, by measuring a plasma emission intensity for the wavelength of a light, that is, by measuring an emitted-light spectrum, it is possible to measure a change corresponding to an increase in quantity of the reaction-generated substance. The state of the change varies in dependence on the composition of the gas and the material being etched. However, a relation between the CD gain and the emitted-light spectrum of the plasma can be measured in advance and data representing a result of measurement can thus be supplied to the etching-condition adjustment unit 100 beforehand. The etching-condition adjustment unit 100 converts a change in output of the emitted-light monitor 34 into an adjustment quantity of the duty ratio and the control apparatus 10a changes the duty ratio of the high-frequency bias power supply 28.

In this way, data representing a relation between the emitted-light spectrum and the CD-gain value is supplied to the etching-condition adjustment unit 100 of the control apparatus 10a to be stored therein or, as an alternative, data is stored for each wafer process.

In the apparatus with the configuration described above, the emitted-light monitor 34 measures an emitted-light spectrum for each wafer process and the etching-condition adjustment unit 100 selects or computes such a small or large duty ratio that the CD gain has a value within an allowable range. Then, the control apparatus 10a transmits a signal for adjusting the duty ratio of the high-frequency bias power supply 28 and the peak value (the amplitude) of its output to the high-frequency bias power supply 28 in order to adjust the duty ratio of the high-frequency bias power supply 28 and the peak voltage of the high-frequency bias power supply 28. As a result, the control apparatus 10a is capable of adjusting the duty ratio of a high-frequency bias output by the high-frequency bias power supply 28 in a real-time manner in accordance with variations in emitted-light spectrum from wafer process to wafer process.

FIG. 8 shows a flowchart representing the processing described above. First of all, at a step 802, the etching process is started. Then, at the next step 804, a value output by the emitted-light monitor 34 is measured. Subsequently, at the next step 806, the measured value's change from a previously monitored value is found. Then, the flow of the processing goes on to a step 808 to determine whether the change is within an allowable range. If the change is within the allowable range, the process is carried out with conditions kept as they are. If the determination result obtained at the step 808 indicates that the change is beyond the allowable range, on the other hand, the flow of the processing goes on to a step 810 to execute duty control of turning the high-frequency bias on and off repeatedly, that is, control of changing the duty ratio. In either case, the flow of the processing then goes on to a step 812 to determine whether the etching process of a wafer has been completed. If the etching process of a wafer has not been completed, the flow of the processing goes back to the step 804 to continue the processing to measure monitored values. If the determination result obtained at the step 812 indicates that the etching process of a wafer has been completed, on the other hand, the processed wafer is conveyed out to be collected. Then, the flow of the processing goes on to a step 814 to determine whether a predetermined number of wafers have been processed. If a predetermined number of wafers have been processed, the processing is ended.

In accordance with the second embodiment described above, the duty ratio of the high-frequency bias power supply 28 can be adjusted in dependence on the emitted-light spectrum, that is, in dependence on the value of the CD gain. Thus, much like the first embodiment described previously, the fabricated-line width of each wafer can be adjusted to an optimum value and the required fabrication precision can be achieved. As a result, much like the first embodiment described previously, there is provided an effect of suppressing variations in fabricated-line dimension from wafer to wafer so as to implement the fabrication with a high degree of reproducibility. Thus, the method implemented by this embodiment is suitable for fabrication of infinitesimal semiconductor devices of a dimension level in the range from 0.05 microns to 0.1 microns having a problem that the fabricated-line dimension varies from wafer to wafer.

It is to be noted that the intensity of a signal representing the emitted-light spectrum of the plasma can also be treated as an intensity of a signal having a specific wavelength. In addition, as a multi-variable analysis technique, it is possible to adopt a commonly known principal component analysis method for converting the intensity of the signal into a parameter found from a principal component having a closest correlation with the CD gain or a synthesis of some principal components.

In addition, while an emitted-light spectrum is used in this embodiment, another monitored quantity representing the state of the plasma-etching apparatus is also conceivable. Examples of the other monitored quantity include the impedance of the power-supply circuit, the composition of the plasma and the waveform of a voltage output by the high-frequency bias power supply 28.

Third Embodiment

Next, a third embodiment of the present invention is explained. The emitted-light spectrum of the plasma or the other monitored quantities described above may all of a sudden change to a value within a possible range of plasma processing. In such a case, the change can be conceived as being caused by a change in hardware. Examples of the change in hardware include wear or deterioration of a component employed in an electrical circuit introducing the plasma. Since such a change is recognized as an abnormality, in this case, as an immediate measure, the bias voltage is corrected to prevent a wafer being processed from becoming a bad wafer. Thus, control needs to be executed to adjust a power being subjected to constant-power control exercised as part of the on-off control to an optimum value. It is to be noted that the configuration of an apparatus implemented by the third embodiment is the same as the second embodiment except the etching-condition adjustment unit 100.

Figure 9:
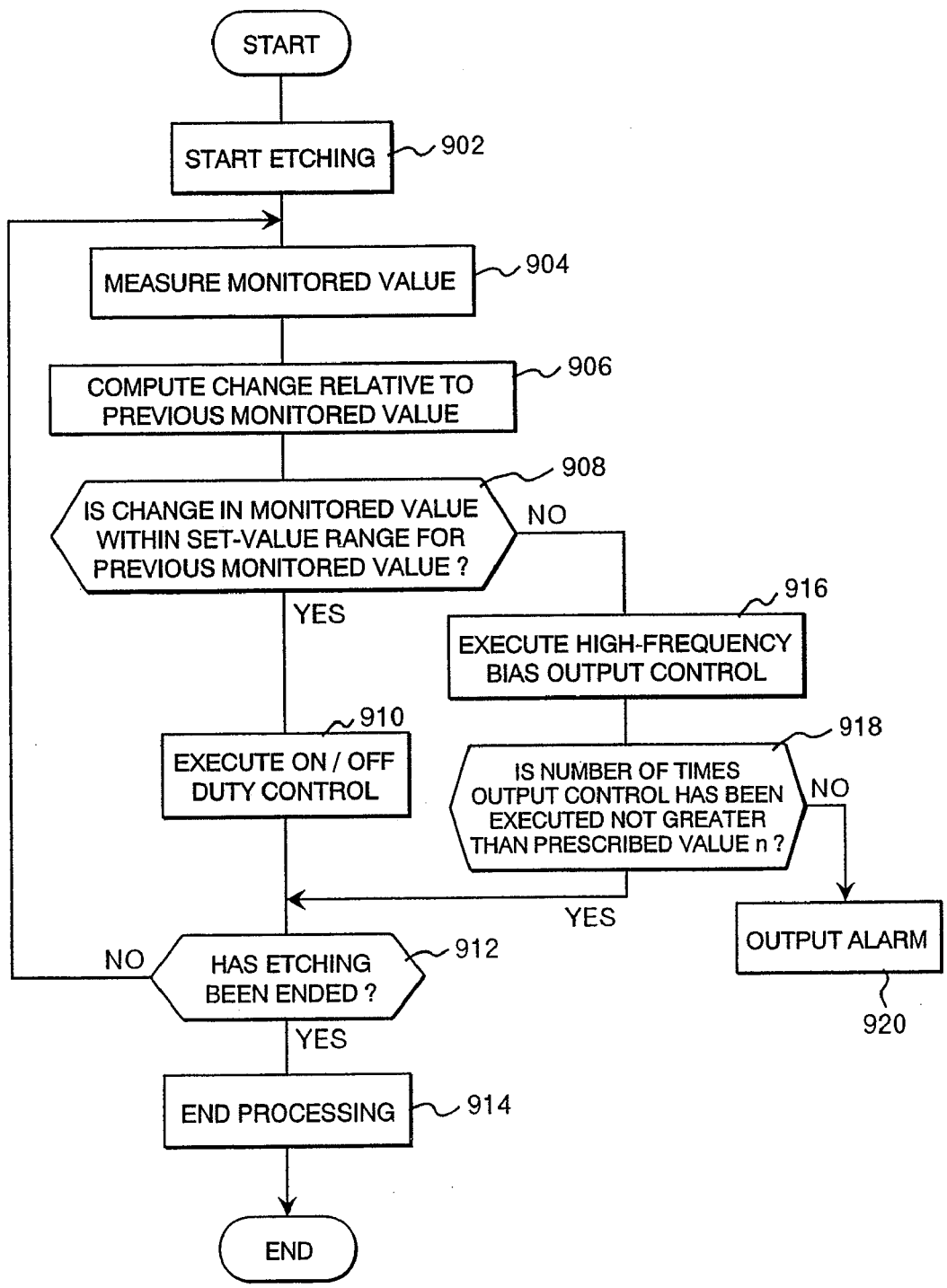
FIG. 9 shows a flowchart representing a control method adopted by a third embodiment of the present invention.

FIG. 9 shows a flowchart representing control executed by the etching-condition adjustment unit 100 employed in the third embodiment. First of all, at a step 902, an etching process is started. Then, at the next step 904, a value output by the emitted-light monitor 34 is measured. Subsequently, at the next step 906, the measured value's change from a previously monitored value is found. Then, the flow of the processing goes on to a step 908 to determine whether the change is within an allowable range. If the change is within the allowable range, the flow of the processing goes on to a step 910 to execute normal control of changing the duty ratio by turning the high-frequency bias on and off repeatedly. The flow of the processing then goes on to a step 912 to determine whether the etching process of a wafer has been completed. If the etching process of a wafer has not been completed, the flow of the processing goes back to the step 904 to repeat the processing of measuring a monitored value. If the etching process of a wafer has been completed, on the other hand, the flow of the processing goes on to a step 914 at which the processed wafer is conveyed out to be collected. If the determination result obtained at the step 908 indicates that the change is beyond the allowable range, that is, the change found at the step 906 is beyond a range of set values (allowable values) relative to a previously monitored value, on the other hand, an abnormality caused by a change in hardware is recognized. Examples of the change in hardware include wear or deterioration of a component employed in an electrical circuit introducing the plasma. In this case, the flow of the processing goes on to a step 916 at which, as an immediate measure, the bias voltage is corrected to prevent a wafer being processed from becoming a bad wafer. Thus, control needs to be executed to adjust the output of the on-off control, that is, the power, to an optimum value. Then, the flow of the processing goes on to a step 918 to determine whether the change found at the step 906 is beyond the range of set values (allowable values) relative to a previously monitored value consecutively a predetermined number of times even if such control is executed. If the change found at the step 906 is beyond the range of set values (allowable values) relative to a previously monitored value consecutively the predetermined number of times, a kind of abnormality of the apparatus or abnormality of the processing condition is determined to exist. In this case, the flow of the processing goes on to a step 920 at which an alarm is output and the apparatus enters a state of waiting for the line operator to take a concrete action.

Also in this case, it is possible to input a relation between the change in monitored value and the output value of the high-frequency bias and conditions for outputting an alarm as data in advance or store data for each process in a database.

Fourth Embodiment

Next, a fourth embodiment of the present invention is explained. In the case of the first embodiment, the high-frequency voltage is subjected to the on-off control as shown in FIG. 2B. In the case of the fourth embodiment, on the other hand, a period is divided into 3 or more sub-periods T1, T2, . . . and Tm. Then, control is executed to set the output power (or the amplitude) of the high-frequency bias at P1, P2, . . . and Pm for the sub-periods T1, T2, . . . and Tm respectively.

Figure 10:
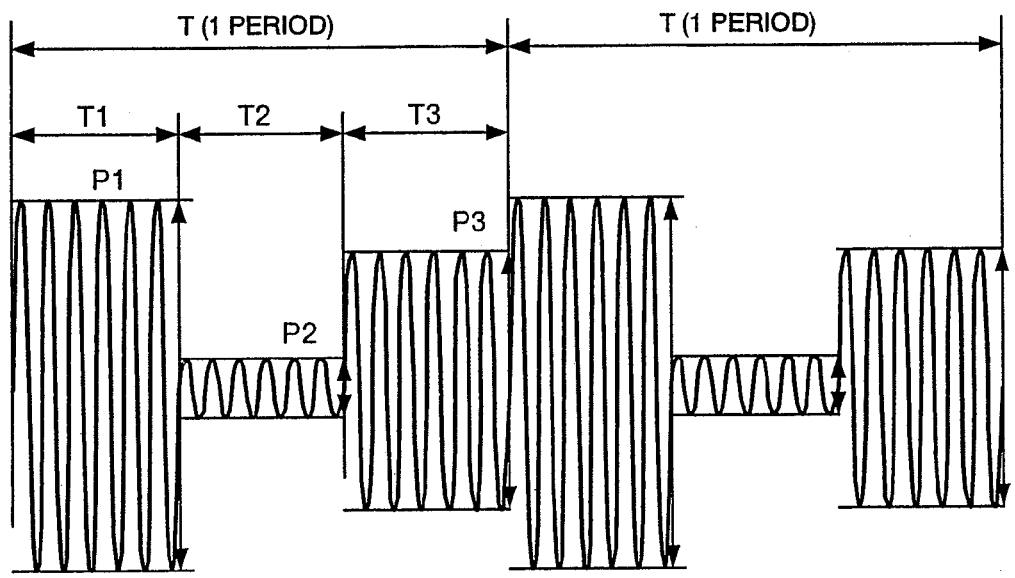
FIG. 10 is a diagram showing a method of applying a high-frequency voltage in accordance with a fourth embodiment of the present invention.
Figure 11:
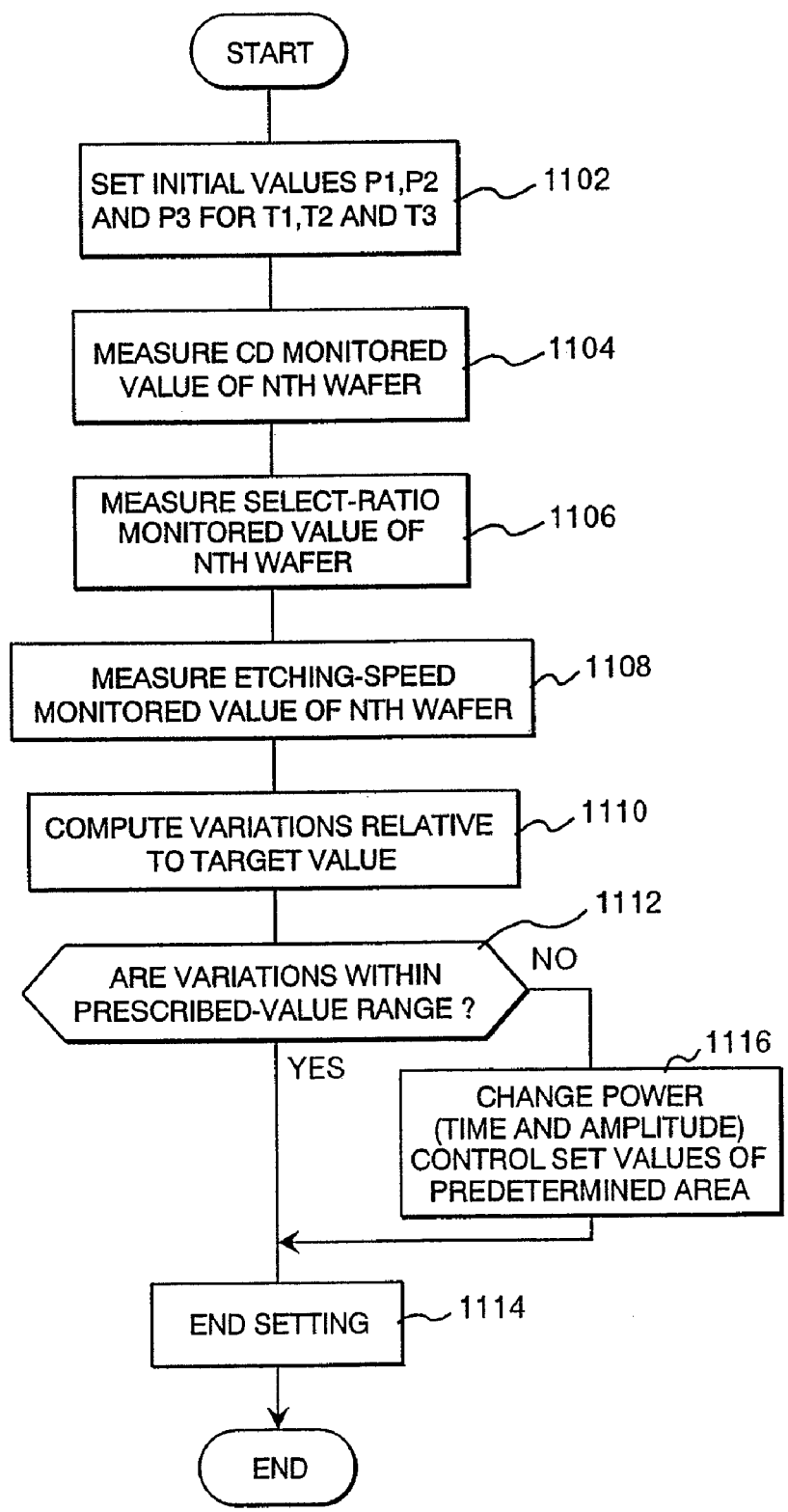
FIG. 11 shows a flowchart representing a control method adopted by the embodiment shown in FIG. 10.

This embodiment is explained by referring to FIGS. 10 to 12 as follows. FIG. 10 is a diagram showing a case in which a period is divided into 3 sub-periods. FIG. 11 shows a flowchart representing processing carried out by using the high-frequency powers shown in FIG. 10. As shown in FIG. 11, the flowchart begins with a step 1102 at which the etching process is started. To put it concretely, m is set at 3 where m is the number of sub-periods into which a period is divided, and powers P1, P2 and P3 are set for the 3 sub-periods T1, T2 and T3 respectively. For example, the powers P1, P2 and P3 are set at 100 W, 10 W and 30 W respectively. Then, at the next steps 1104, 1106 and 1108, an etching-process-completing wafer's CD value, select ratio and etching speed respectively are measured by using typically the measurement & inspection apparatus described earlier. If a determination result obtained at the step 1112 indicates that the results of the measurements show that all changes are each within a range of specification values, the flow of the processing goes on to a step 1114 at which the processing to set control values is ended without making any change to existing conditions. If any of the changes are beyond the range of specification values, on the other hand, the flow of the processing goes on to a step 1116 at which any of the sub-periods T1 to T3 and the powers P1 to P3 are set to new values before starting the process of the next wafer.

Figure 12A:
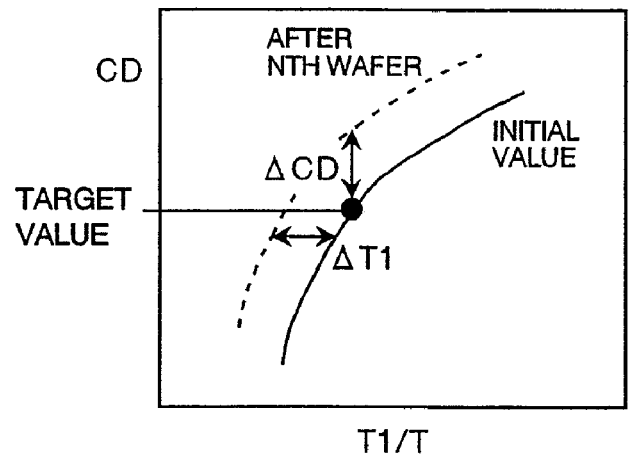
FIG. 12 is diagrams showing a relation between a duty ratio of a high-frequency voltage of a high-frequency power generated in the embodiment shown in FIG. 10 and the CD gain, a relation between the amplitude of a high-frequency voltage of the high-frequency power generated in the same embodiment and the select ratio, as well as a relation between the duty ratio of a high-frequency voltage of the high-frequency power generated in the same embodiment and the etching speed.
Figure 12B:
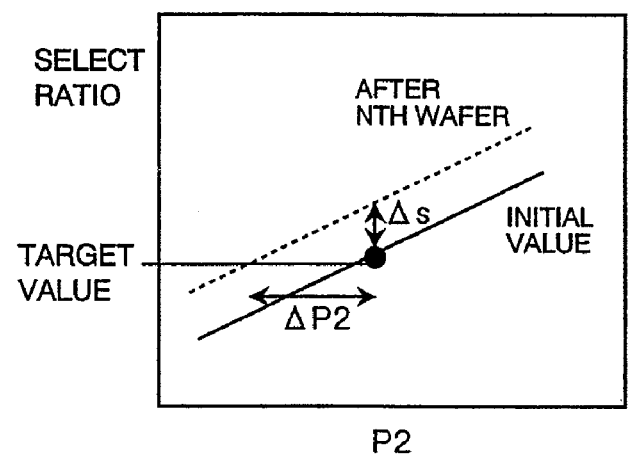
Figure 12C:
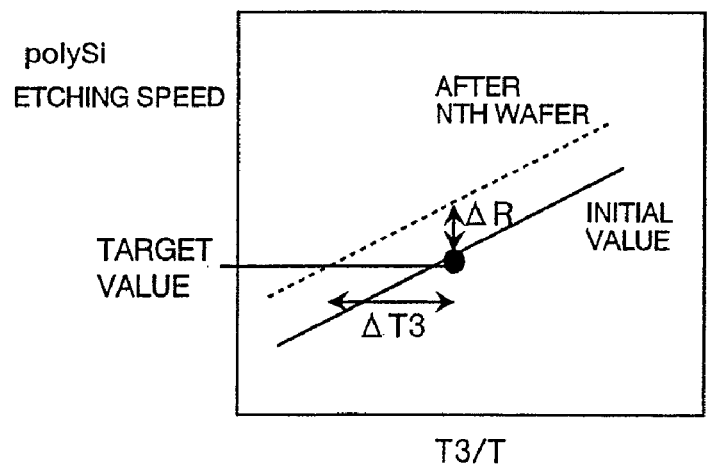

As shown in FIG. 10, for example, a period is divided into 3 sub-periods to result in characteristics shown in FIG. 12. In the sub-period T1, control is executed to generate a largest amplitude and, hence, a largest ion energy. The ratio of the sub-period length to the period length is a CD predominant factor. Thus, the CD value is adjusted by controlling the ratio of the sub-period T1 as shown in FIG. 12A. In addition, by changing the amplitude in the sub-period T2, for which a smallest amplitude is generated, to a smaller value or, in other words, by changing the supplied power, the select ratio can be adjusted finely as shown in FIG. 12B. Of course, by changing the amplitude in another sub-period, the select ratio can also be varied. In this case, however, variations in select ratio are large, making control difficult to execute. In addition, the CD value and other quantities also inevitably change as well. Thus, in order to finely adjust the select ratio by very much suppressing effects on the other quantities such as the CD value, fine adjustment of the amplitude for the sub-period T2 is an appropriate way. Finally, the sub-period T3 having an intermediate amplitude can be used for adjustment of the etching speed of poly-Si. The amplitude for the sub-period T3 is set at a value slightly greater than a threshold value at which a reaction-generated substance is accumulated on the wafer. At a value slightly greater than the threshold value, the etching speed of poly-Si is affected. It is thus necessary to adjust the amplitude so as to avoid a big effect on an oxide film rate. By changing the ratio of the sub-period T3 on the basis of this adjustment, the etching speed of poly-Si can be controlled as shown in FIG. 12C.

To put it concretely, if the CD value changes by $\Delta CD$ after the process of the Nth wafer, the ratio of the sub-period T1 is changed by $\Delta T1$ as shown in FIG. 12A so as to restore the CD value to a target value before processing the next wafer. If the select ratio changes by $\Delta S$, the amplitude for the sub-period T2 is changed by $\Delta P2$ as shown in FIG. 12B before processing the next wafer. In this way, the select ratio can be sustained at a target value. By the same token, if the etching speed of poly-Si changes by $\Delta R$, the ratio of the sub-period T3 is changed by $\Delta T3$ as shown in FIG. 12C so as to maintain the etching speed of poly-Si to a target value.

Also in the case of this embodiment, the range of the control for changing only a desired control quantity by maintaining other control quantities is not so big. In the case of processing the same products under the same conditions, however, the shape and other attributes naturally remain unchanged. Since it is an object of the present embodiment to slightly adjust a control quantity with the lapse of time, the present invention exhibits a good effect.

Fifth Embodiment

Next, a fifth embodiment of the present invention is explained. In the case of the fifth embodiment, m representing the number of sub-periods is changed in the course of processing. In addition, the sub-periods T1, T2, . . . and Tm composing a period and/or the applied powers P1, P2, . . . and Pm of the high-frequency bias are controlled independently of each other.

Figure 13:
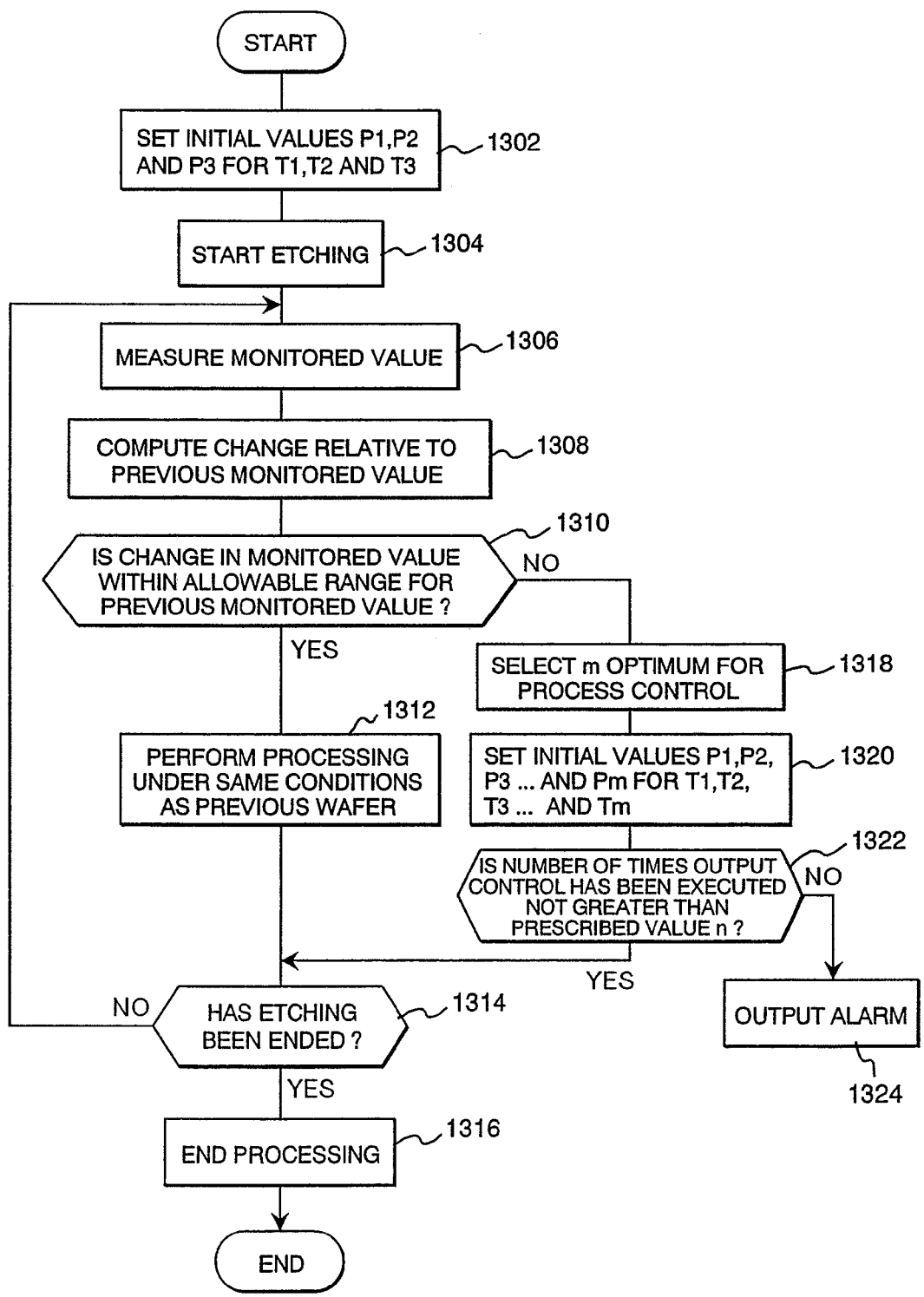
FIG. 13 shows a flowchart representing a control method adopted by a fifth embodiment of the present invention.

FIG. 13 shows a flowchart representing processing carried out by this embodiment. As shown in the figure, the flowchart begins with a step 1302 to set the sub-periods T1, T2, . . . and T3 and the applied powers P1, P2, . . . and P3 at initial values. Then, at the next step 1304, the etching process is started. At the next step 1306 after starting the etching process, a monitored value of the plasma emitted-light intensity in the etching process is measured. Subsequently, at the next step 1308, a change of the measured monitored value from an immediately preceding monitored value is found. Then, the flow of the processing goes on to a step 1310 to determine whether the change is within an allowable range. If the change is within the allowable range, the flow of the processing goes on to a step 1312 at which the etching process is carried out by execution of the duty-ratio feedback control under the conditions remaining the same as they are. Subsequently, the flow of the processing goes on to a step 1314 to determine whether the etching process has been completed. If the etching process has been completed, the flow of the processing goes on to a step 1316 at which the processed wafer is conveyed out to be collected. If the determination result obtained at the step 1310 indicates that the change is beyond the allowable range, on the other hand, the flow of the processing goes on to a step 1318 at which m representing the number of sub-periods is changed. Then, the flow of the processing goes on to the next step 1320 to set the sub-periods T1, T2, . . . and Tm and the applied powers P1, P2, . . . and Pm at new values and change the duty ratio before starting the process. Then, the flow of the processing goes on to a step 1322 to determine whether the change found at the step 1308 is beyond the allowable range consecutively a predetermined number of times even if the sub-periods T1, T2, . . . and Tm and the applied powers P1, P2, . . . and Pm are newly set. If the change found at the step 1308 is beyond the allowable range consecutively the predetermined number of times, the flow of the processing goes on to a step 1324 at which an alarm is issued. The magnitude of a change varies if the structure of the processed wafer and/or the etching condition change. It is thus necessary to create a database for storing data obtained for each actual process in advance or to build a database from data accumulated for each wafer process.

This embodiment adopts a method for monitoring and controlling the plasma emitted-light intensity. It is to be noted, however, that it is also possible to have the inspection apparatus inspect a wafer completing the etching process as is the case with the embodiment shown in FIG. 5 and based on the determination at the step 1310 on the data obtained as a result of measurement. In addition, as conditions for the determination at the step 1310, a CD value, a select ratio and/or an etching speed can also be determined as is the case with the embodiment shown in FIG. 11.

Sixth Embodiment

Figure 14:
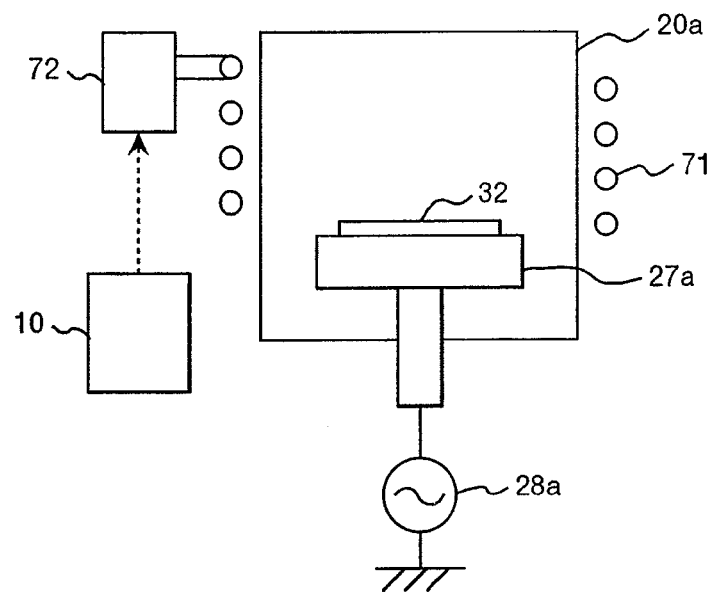
FIG. 14 is a diagram showing the whole configuration of another typical plasma processing apparatus provided by the present invention.

Next, a sixth embodiment of the present invention is explained. The sixth embodiment is different from the first embodiment in that, in the sixth embodiment, a plasma processing apparatus using an inductive-coupling plasma source is employed as a substitute for the ECR plasma apparatus employed in the first embodiment, and control to turn on and off a high-frequency voltage for generating plasma is executed as the on-off control of the high-frequency voltage. The sixth embodiment is explained by referring to FIG. 14. A 13.56-MHz high-frequency voltage generated by a high-frequency power supply 72 is applied to an induction coil 71 provided outside of the vacuum processing chamber 20a, being turned on and off in order to generate plasma in the vacuum processing chamber 20a. A lower electrode 27a serving as a sample base is connected to a high-frequency bias power supply 28a for accelerating ions.

In an ON period of the high-frequency power supply 72, ions are generated in the plasma. The ions are accelerated by the high-frequency bias power supply 28a for generating a bias. The ions hit the wafer in a direction perpendicular to the surface of the wafer, causing a perpendicular etching process to be carried forward on the wafer. In an OFF period of the high-frequency power supply 72, on the other hand, ions vanish from the plasma, stopping the perpendicular etching process and, at the same time, a reaction-generated substance included in the gas diffuses onto the wafer, being accumulated therein. That is, there is exhibited the same effect as the control to turn on and off the high-frequency voltage applied to the lower electrode 27a. This effect sustains the uniformity and the select ratio, allowing the CD value representing the etching shape to be controlled.

The control to turn the high-frequency power supply 72 on and off can be executed in the same way as the first to fifth embodiments described earlier. In addition, it is needless to say that, in this embodiment, control can be executed to turn on and off the high-frequency voltage applied to the lower electrode 27a.

Seventh Embodiment

Figure 15:
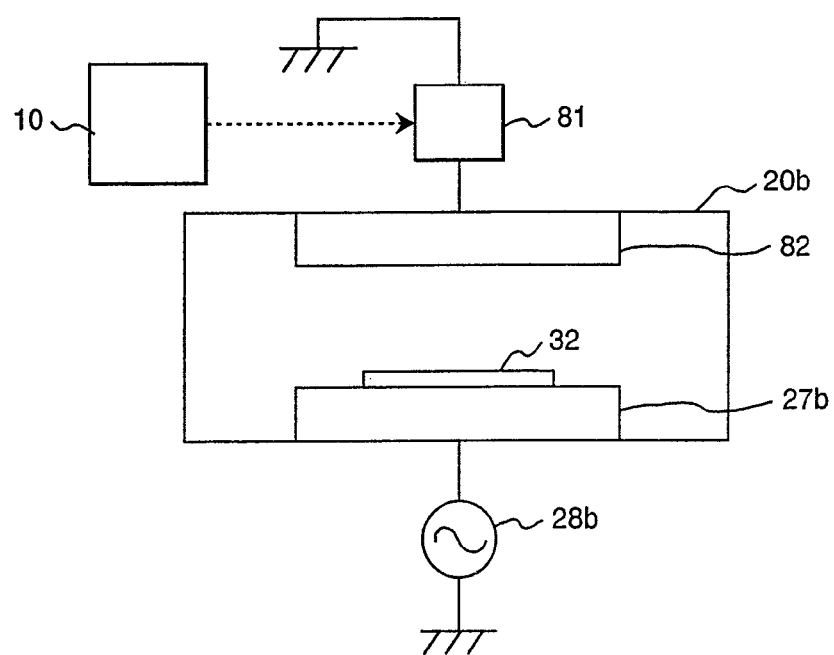
FIG. 15 is a diagram showing the whole configuration of a further typical plasma processing apparatus provided by the present invention.

Next, a seventh embodiment of the present invention is explained. This embodiment implements a capacitive-coupling plasma processing apparatus as the plasma processing apparatus described above. This embodiment is explained by referring to FIG. 15. 2 parallel planar electrodes 82 and 27b are installed in the vacuum processing chamber 20b. The upper electrode 82 is connected to a high-frequency power supply 81 for generating plasma. On the lower electrode 27b, a wafer is placed. The lower electrode 27b is connected to the high-frequency bias power supply 28b for accelerating ions. Much like the sixth embodiment, in the seventh embodiment, either of the high-frequency power supplies is subjected to the on-off control. As an alternative, control can be executed in the same way as the first to fifth embodiments described earlier.

As described above, in accordance with the embodiments of the present invention, there is provided an effect of an ability to fabricate a wafer with a high degree of reproducibility by suppressing variations in fabricated-line dimension from wafer to wafer without lowering the throughput.

It is to be noted that data for the etching process carried out in each of the embodiments can be stored in the control apparatus employed in the plasma processing apparatus or stored in an upper-level control apparatus for controlling semiconductor manufacturing lines. In addition, the semiconductor manufacturer can be connected to the fabrication equipment manufacturer by a network such as the Internet so that data stored in the fabrication equipment manufacturer can be used by the semiconductor manufacturer.

What is claimed is:

1. A plasma processing method for processing a sample by applying a high-frequency bias power for each period (T) which is divided into a first sub-period (T1), a second sub-period (T2), and a third sub-period (T3) along a time axis;
    wherein the first sub-period (T1) is used as a sub-period for which feedback control of a CD gain is executed;
    the second sub-period (T2) used a sub-period for which feedback control of a select ratio is executed; and
    the third sub-period (T3) is used as a sub-period for which feedback control of the CD gain and feedback control of the select ratio are executed;
    wherein the applied power is set at a large value in the first sub-period;
    wherein a duty ratio T1/T is controlled in accordance with the CD gain; and
    wherein the processing method comprises the steps of:
    controlling for each period (T), the first sub-period (T1) so as to be applied with a largest amplitude power of the sub-periods (T1-T3), the second sub-period (T2) so as to be applied with a smallest amplitude power of the sub-periods (T1-T3), and the third sub-period (T3) so as to be applied with an intermediate amplitude power which is intermediate the largest and smallest amplitude power;
    processing a plurality of samples with a predetermined processing condition;
    measuring the CD gain, the select ratio and an etching speed of each of the samples; and
    executing a feedback control for each processing unit of the samples in accordance with a change of processing state of each of the samples so that the duty ratio T1/T is controlled in accordance with the measured CD gain, and an average applied power over each period (T) is constant.

2. A plasma processing method according to claim 1, wherein the steps of executing feedback control includes:
    reducing the duty ratio when the CD gain is larger than a preset value; and
    increasing the duty ratio when the CD gain is smaller than the preset value.

* * * * *